(12) United States Patent
Grunzke

(10) Patent No.: US 10,014,070 B2
(45) Date of Patent: Jul. 3, 2018

(54) DATA PATH INTEGRITY VERIFICATION IN MEMORY DEVICES

(71) Applicant: Micron Technology, Inc., Boise, ID (US)

(72) Inventor: Terry Grunzke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 168 days.

(21) Appl. No.: 13/919,135

(22) Filed: Jun. 17, 2013

(65) Prior Publication Data

US 2014/0198580 A1    Jul. 17, 2014

Related U.S. Application Data

(60) Provisional application No. 61/752,137, filed on Jan. 14, 2013.

(51) Int. Cl.
*G11C 29/00* (2006.01)
*G11C 29/02* (2006.01)

(52) U.S. Cl.
CPC ................... *G11C 29/025* (2013.01)

(58) Field of Classification Search
CPC .... G11C 16/0483; G11C 29/00; G11C 29/025
USPC .......... 365/185.17, 185.09, 185.22; 711/168, 711/143, 118
See application file for complete search history.

(56) References Cited

U.S. PATENT DOCUMENTS

| 5,825,786 | A | 10/1998 | Burns |
| 7,353,432 | B1 | 4/2008 | Talagala et al. |
| 7,908,512 | B2 | 3/2011 | Deenadhayalan et al. |
| 8,037,380 | B2 * | 10/2011 | Cagno ................. G06F 11/1064 711/118 |
| 8,176,406 | B2 | 5/2012 | Prasky et al. |
| 8,291,303 | B2 | 10/2012 | Toda |
| 2005/0289314 | A1 * | 12/2005 | Adusumilli ......... G06F 11/1068 711/168 |
| 2007/0070675 | A1 | 3/2007 | Do |
| 2009/0254785 | A1 * | 10/2009 | Grunzke ................ G11C 29/36 714/719 |

OTHER PUBLICATIONS

"International Search Report", PCT/ISA/210, PCT/US2014/010595, Korean International Property Office, dated May 13, 2014, 3 pgs.
European Search Report for EP Application No. 14737698.2, dated Sep. 6, 2016 (6 pages).

* cited by examiner

*Primary Examiner* — Alexander Sofocleous
*Assistant Examiner* — Alfredo Bermudez Lozada
(74) *Attorney, Agent, or Firm* — Dicke, Billig & Czaja, PLLC

(57) ABSTRACT

Methods and memories for verifying data path integrity are provided. In one such method, a first set of data are read from a first register of a memory device while a second set of data are written to an array of the memory device. The read first set of data and the data written to the first register are compared to verify data path integrity.

19 Claims, 7 Drawing Sheets

DATA PATH INTEGRITY VERIFICATION IN MEMORY DEVICES

RELATED APPLICATIONS

This application claims the benefit of U.S. Provisional Application No. 61/752,137 filed on Jan. 14, 2013, hereby incorporated herein in its entirety by reference.

TECHNICAL FIELD

The present embodiments relate generally to memory devices and a particular embodiment relates to data path integrity in memory devices

BACKGROUND

Memory devices (which are sometimes referred to herein as "memories") are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common electronic systems that utilize flash memory devices include, but are not limited to, personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a string of memory cells is coupled in parallel with each memory cell coupled to a data line, such as those typically referred to as digit (e.g., bit) lines. In NAND flash architecture, a string of memory cells is coupled in series with only the first memory cell of the string coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Data integrity, in the form of bit errors, can be affected by more than one part of a memory device. For example, bit error rates may arise from data path bit errors and from array bit errors. Array path errors typically are caused by failure of data cells to properly program, or by cells that have threshold voltage shifts from their desired threshold voltages.

A data path in a memory device, such as a NAND memory device, comprises a physical path between an array of memory cells, registers such as a page register and a cache register, and input/output (I/O) pads, with conductive traces connecting the components. I/O pads are typically bonded out external to the memory device, and can be physically separated from the array and registers by a large portion of a die. Data path errors can occur due to, for example, signal integrity issues, power delivery issues, ground bounce, noise, and the like. Such data path errors can further corrupt or increase a rate or severity of array path errors (array errors are cell failure or Vt shift). Data path errors can be sporadic, but largely unpredictable. Data path bit errors may be referred to as hard errors.

A controller for a memory device typically has available an amount of error correction allowing the controller to fix some level of raw bit error rates (RBER). With schemes for error correction, such as low density parity check (LDPC) and other types of error correction, hard errors are more difficult to correct, and use much more of any available amount of error correction. When a memory device error occurs, a user cannot normally distinguish which type of error, data path bit error or array bit error, caused the error.

For the reasons stated above and for other reasons that will become apparent to those skilled in the art upon reading and understanding the present specification, there is a need in the art for distinguishing between data path bit errors and array bit errors in memories.

DETAILED DESCRIPTION

Figure 1:
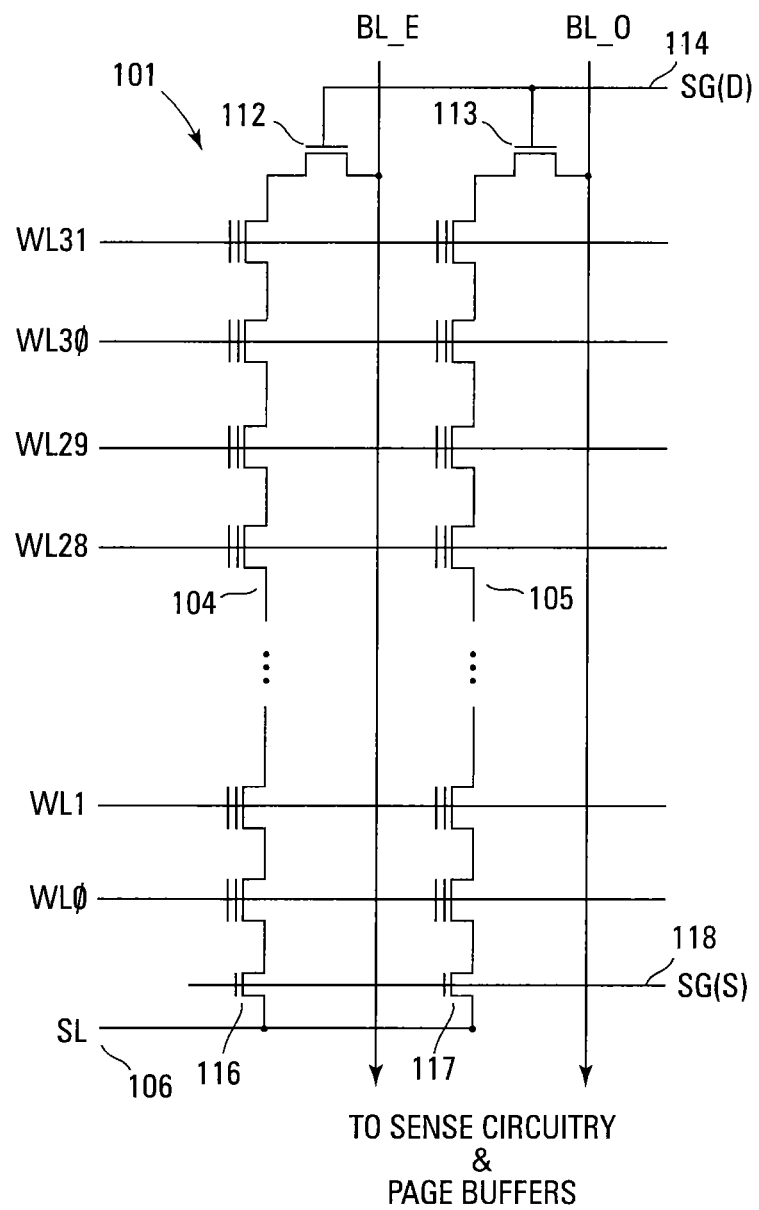
FIG. 1 is a schematic diagram of one embodiment of a portion of a NAND architecture memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Non-volatile memory can utilize different architectures including NOR and NAND. The architecture designation is derived from the logic used to read the devices. In NOR architecture, a logical column of memory cells is coupled in parallel with each memory cell coupled to a data line, such as those typically referred to as bit lines. In NAND architecture, a column of memory cells is coupled in series with only the first memory cell of the column coupled to a bit line.

FIG. 1 illustrates a schematic diagram of one embodiment of a portion of a NAND architecture memory array 101 comprising series strings of non-volatile memory cells.

The memory array 101 comprises an array of non-volatile memory cells (e.g., floating gate) arranged in columns such as series strings 104, 105. Each of the cells is coupled drain to source in each series string 104, 105. An access line (e.g., word line) WL0-WL31 that spans across multiple series strings 104, 105 is coupled to the control gates of each memory cell in a row in order to bias the control gates of the memory cells in the row. Data lines, such as even/odd bit lines BL_E, BL_O, are coupled to the series strings and eventually coupled to sense circuitry and page buffers that detect and store the state of each cell by sensing current or voltage on a selected bit line.

Each series string 104, 105 of memory cells is coupled to a source line 106 by a source select gate 116, 117 (e.g., transistor) and to an individual bit line BL_E, BL_O by a drain select gate 112, 113 (e.g., transistor). The source select gates 116, 117 are controlled by a source select gate control line SG(S) 118 coupled to their control gates. The drain select gates 112, 113 are controlled by a drain select gate control line SG(D) 114.

In a typical prior art programming of the memory array, each memory cell is individually programmed as either a single level cell (SLC) or a multiple level cell (MLC). A cell's threshold voltage (Vt) can be used as an indication of the data stored in the cell. For example, in an SLC memory device, a Vt of 2.5V might indicate a programmed cell while a Vt of −0.5V might indicate an erased cell. In an MLC memory device, multiple Vt ranges can each indicate a different state by assigning a bit pattern to a specific Vt range.

Figure 2:
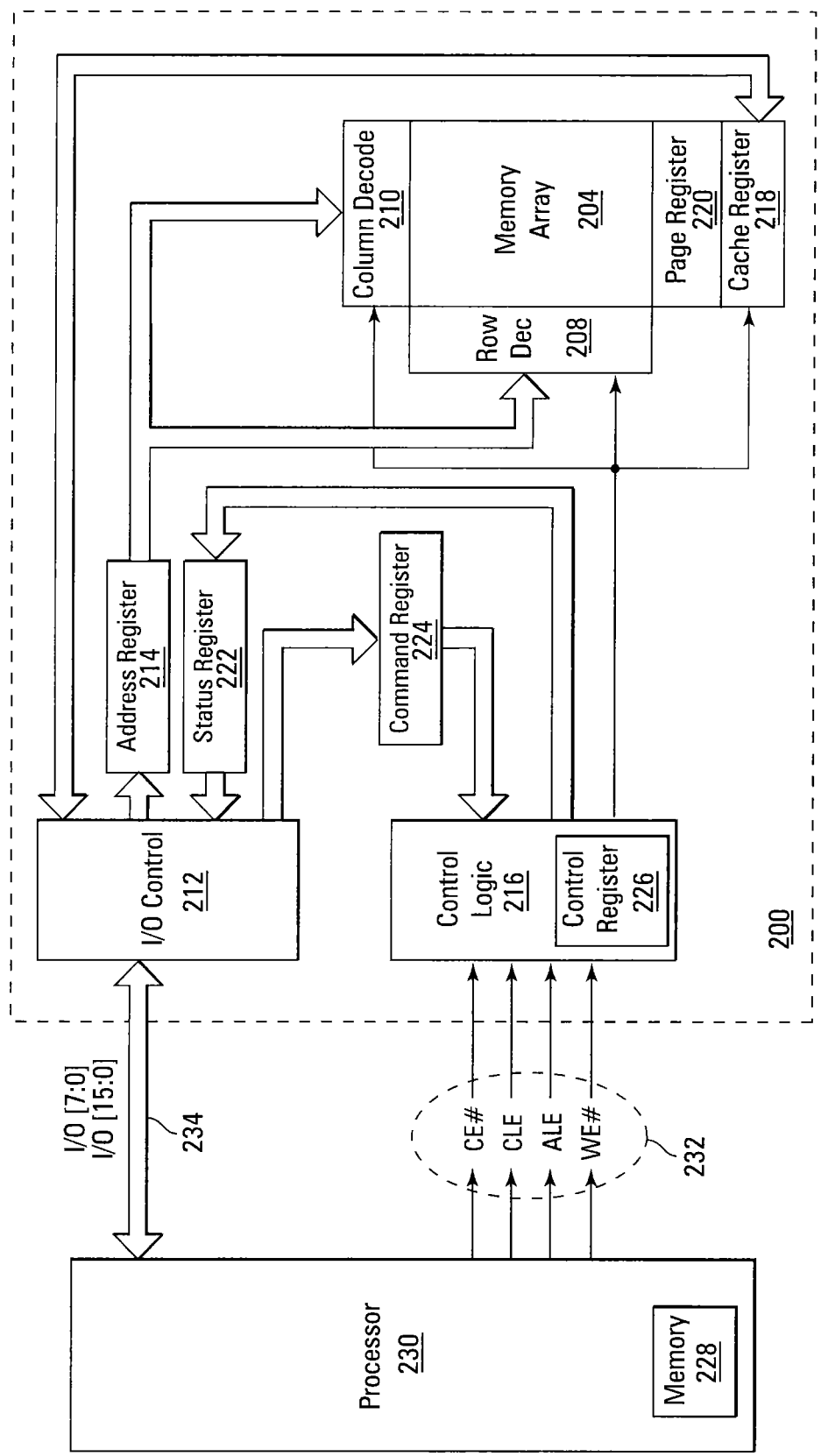
FIG. 2 is a block schematic of an electronic system in accordance with an embodiment of the disclosure.

FIG. 2 is a simplified block diagram of a first apparatus in the form of a memory device 200 in communication with a second apparatus, in the form of a processor 230, as part of a third apparatus, in the form of an electronic system, according to an embodiment. Some examples of electronic systems include computer servers, network devices, personal computers, personal digital assistants (PDAs), digital cameras, digital media players, digital recorders, games, appliances, vehicles, wireless devices, cellular telephones and the like. The processor 230 may be a memory controller or other external host device.

Memory device 200 includes an array of memory cells 204 logically arranged in rows and columns Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column.

A row decode circuitry 208 and a column decode circuitry 210 are provided to decode address signals. Address signals are received and decoded to access the array of memory cells 204. Memory device 200 also includes input/output (I/O) control circuitry 212 to manage input of commands, addresses and data to the memory device 200 as well as output of data and status information from the memory device 200. An address register 214 is in communication with I/O control circuitry 212 and row decode circuitry 208 and column decode circuitry 210 to latch the address signals prior to decoding. A command register 224 is in communication with I/O control circuitry 212 and control logic 216 to latch incoming commands.

Control logic 216 controls access to the array of memory cells 204 in response to the commands and generates status information for the external processor 230. The control logic 216 is in communication with row decode circuitry 208 and column decode circuitry 210 to control the row decode circuitry 208 and column decode circuitry 210 in response to the addresses.

Control logic 216 is also in communication with a cache register 218. Cache register 218 latches data, either incoming or outgoing, as directed by control logic 216 to temporarily store data while the array of memory cells 204 is busy writing or reading, respectively, other data. During a write operation, data is passed from the cache register 218 to page register 220 for transfer to the array of memory cells 204; then new data is latched in the cache register 218 from the I/O control circuitry 212. During a read operation, data is passed from the cache register 218 to the I/O control circuitry 212 for output to the external processor 230; then new data is passed from the page register 220 to the cache register 218. A status register 222 is in communication with I/O control circuitry 212 and control logic 216 to latch the status information for output to the processor 230.

Status register 222 may include a ready/busy register. For example, a 1-bit register could be used to indicate whether the memory device 200 is busy (e.g., that the memory device 200 is performing an access operation) or ready (e.g., that the memory device 200 has completed, or is not performing, an access operation). Thus, reading the status register 222, such as by the processor 230 or the control logic 216, could be used to determine whether the memory device 200 is involved in an access operation or not, e.g., whether or not the memory device is ready to initiate an access operation. Alternatively, or in addition, the control logic 216 of memory device 200 might provide a ready/busy (R/B#) signal to provide an indication to processor 230 of whether or not the memory device 200 is involved in an access operation. For example, memory devices often provide a pin (e.g., a pin of control link 232) that is asserted to a logic low, for example, when the device is involved in an access operation and is pulled up to a logic high when the device is again available (e.g., not involved in an access operation).

Memory device 200 receives control signals at control logic 216 from processor 230 over a control link 232. The control signals may include at least a chip enable CE#, a command latch enable CLE, an address latch enable ALE, and a write enable WE#. Additional control signals (not shown) may be further received or provided over control link 232 depending upon the nature of the memory device 200. Memory device 200 receives command signals (which represent commands), address signals (which represent addresses), and data signals (which represent data) from processor 230 over a multiplexed input/output (I/O) bus 234 and outputs data to processor 230 over I/O bus 234.

For example, the commands are received over input/output (I/O) pins [7:0] of I/O bus 234 at I/O control circuitry 212 and are written into command register 224. The addresses are received over input/output (I/O) pins [7:0] of bus 234 at I/O control circuitry 212 and are written into address register 214. The data are received over input/output (I/O) pins [7:0] for an 8-bit device or input/output (I/O) pins [15:0] for a 26-bit device at I/O control circuitry 212 and are written into cache register 218. The data are subsequently written into page register 220 for programming the array of memory cells 204. Data, e.g., from the array of memory cells 204 or the status register 222, are also output over input/output (I/O) pins [7:0] for an 8-bit device or input/output (I/O) pins [15:0] for a 16-bit device.

It will be appreciated by those skilled in the art that additional circuitry and signals can be provided, and that the electronic system of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Additionally, while specific I/O and command pins are described in accordance with popular conventions for receipt and output of the various signals, it is noted that other combinations or numbers of pins may be used in various embodiments.

It would be desirable to be able to distinguish between data path bit errors and array bit errors in a memory device. It would further be desirable to distinguish between data path bit errors and array bit errors in a memory device at real-time operational speeds. It would also be desirable to distinguish between data path bit errors and array bit errors in a memory device during array operations.

Figure 3:
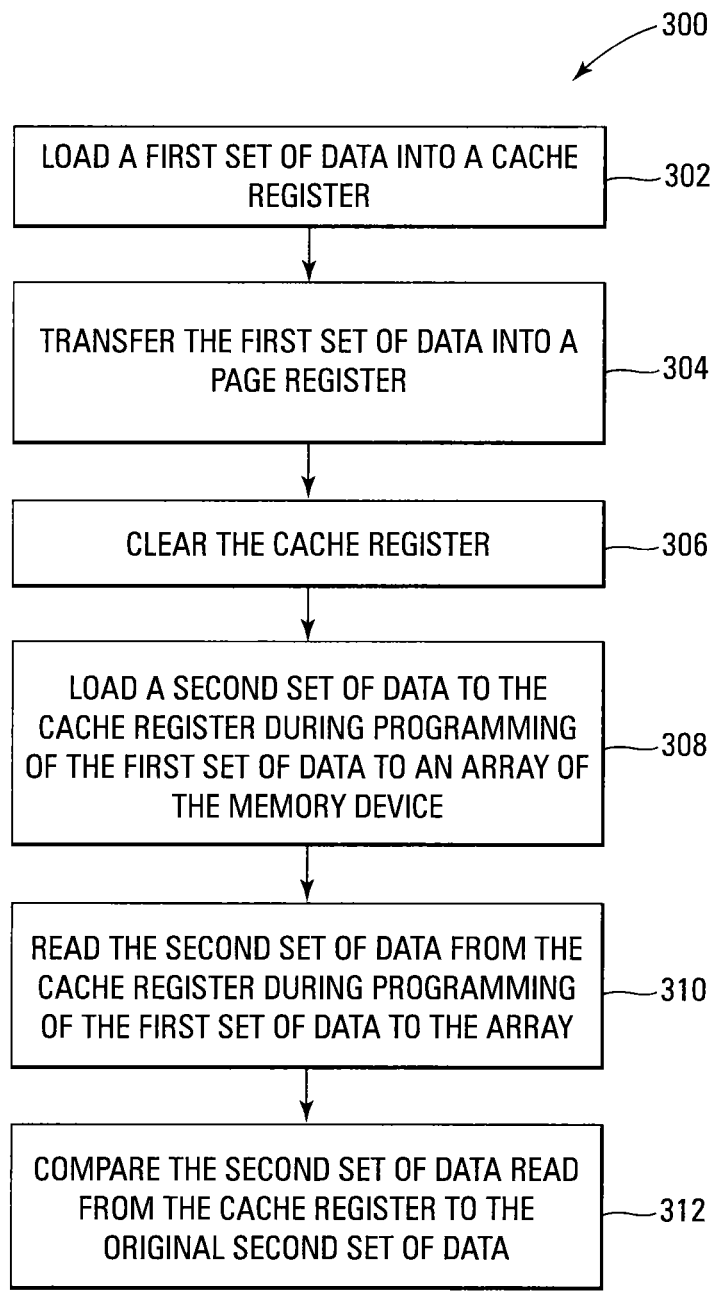
FIG. 3 is a flow chart diagram of a program sequence method according to another embodiment of the disclosure.

Referring to FIG. 3, one method 300 for verifying data path integrity during a program operation is shown. Method 300 comprises, in one embodiment, loading a first set of data into a cache register in block 302, transferring the first set of data into a page register in block 304, clearing the cache register in block 306, loading a second set of data to the cache register during programming of the first set of data to an array of the memory device in block 308, reading the second set of data from the cache register during programming of the first set of data to the array in block 310, and comparing the second set of data read from the cache register to the original second set of data in block 312.

Figure 4:
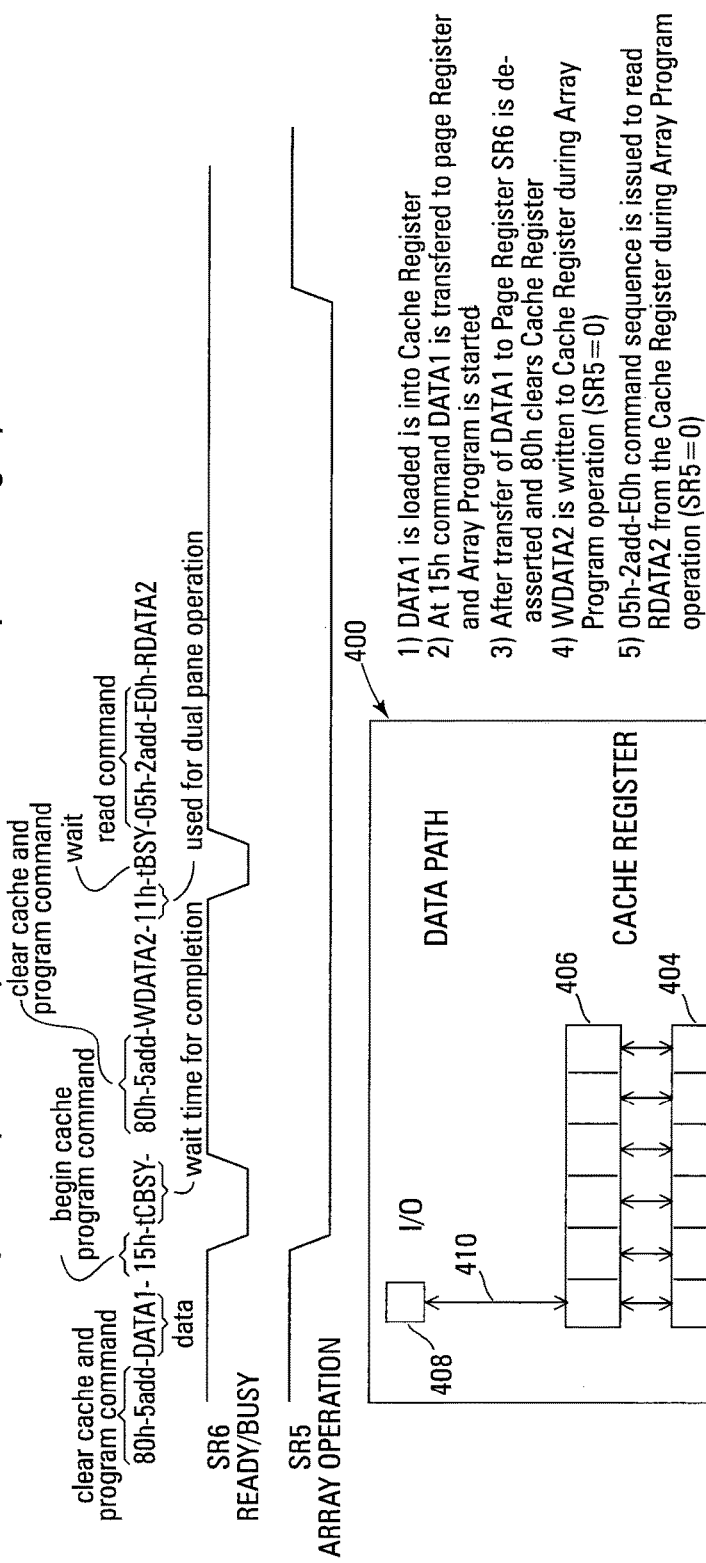
FIG. 4 is a block schematic of a portion of a memory and a timing diagram with operational codes according to a program sequence embodiment of the disclosure.

FIG. 4 shows an example of the operation and operational codes for the method of FIG. 3. A memory device 400 has an array 402, which is connected to and in communication with a page register 404, and the page register is in communication with and connected to a cache register 406. The cache register 406 is connected to I/O pads 408 via data path 410. In operation, commands to a memory take the form of operational codes, or opcodes. Opcodes vary from manufacturer to manufacturer.

In one embodiment, verifying integrity of the data path 410 during programming uses a debug mode of the memory device. Such a mode may be entered by way of a set feature command and a feature address, which will enable a debug mode. To operate an integrity check during a programming operation, a first set of data is loaded into the cache register 406 via the I/O pads 408. This data is loaded from the cache register 406 to the page register 408, and programming begins when array operation bit SR5 goes active (low). A second set of data is written to the cache register 406 during the programming operation, while array operation is still active. After writing the second set of data to cache register 406, and still during active programming of data from page register 404 to array 402, the second set of data is read from the cache register 406, and compared to the original second set of data. If the two sets of data match, data path integrity is confirmed. This is accomplished during a read operation by allowing, through the debug mode, commands normally restricted during array operation. Further, this method bypasses array bit errors by testing only the data path integrity, since no data are being read from the array 402.

It should be understood that many page registers and cache registers are on a typical memory, while only one of each is shown for purposes of illustration.

Figure 5:
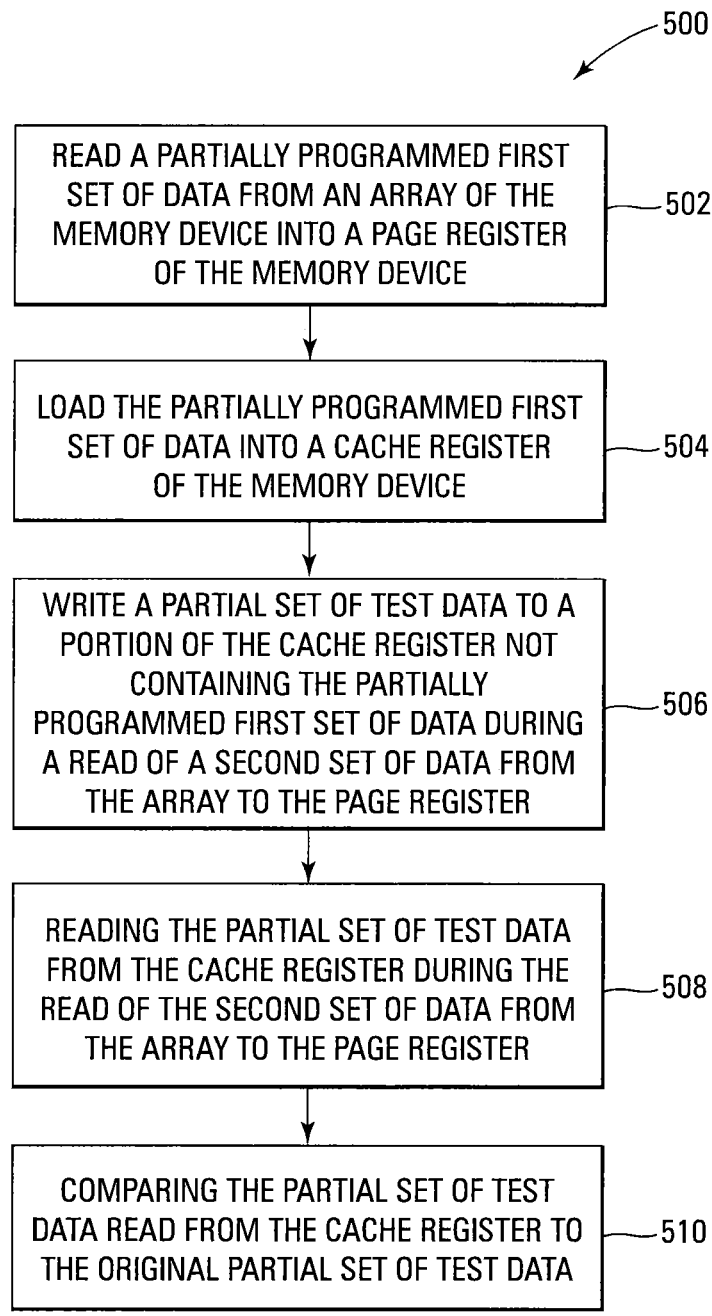
FIG. 5 is a flow chart diagram of a read sequence method according to another embodiment of the disclosure.

Referring to FIG. 5, one method 500 for verifying data path integrity during a read operation is shown. Method 500 comprises, in one embodiment, reading a partially programmed first set of data from an array of the memory device into a page register of the memory device in block 502, loading the partially programmed first set of data into a cache register of the memory device in block 504, writing a partial set of test data to a portion of the cache register not containing the partially programmed first set of data during a read of a second set of data from the array to the page register in block 506, reading the partial set of test data from the cache register during the read of the second set of data from the array to the page register in block 508, and comparing the partial set of test data read from the cache register to the original partial set of test data in block 510.

Figure 6:
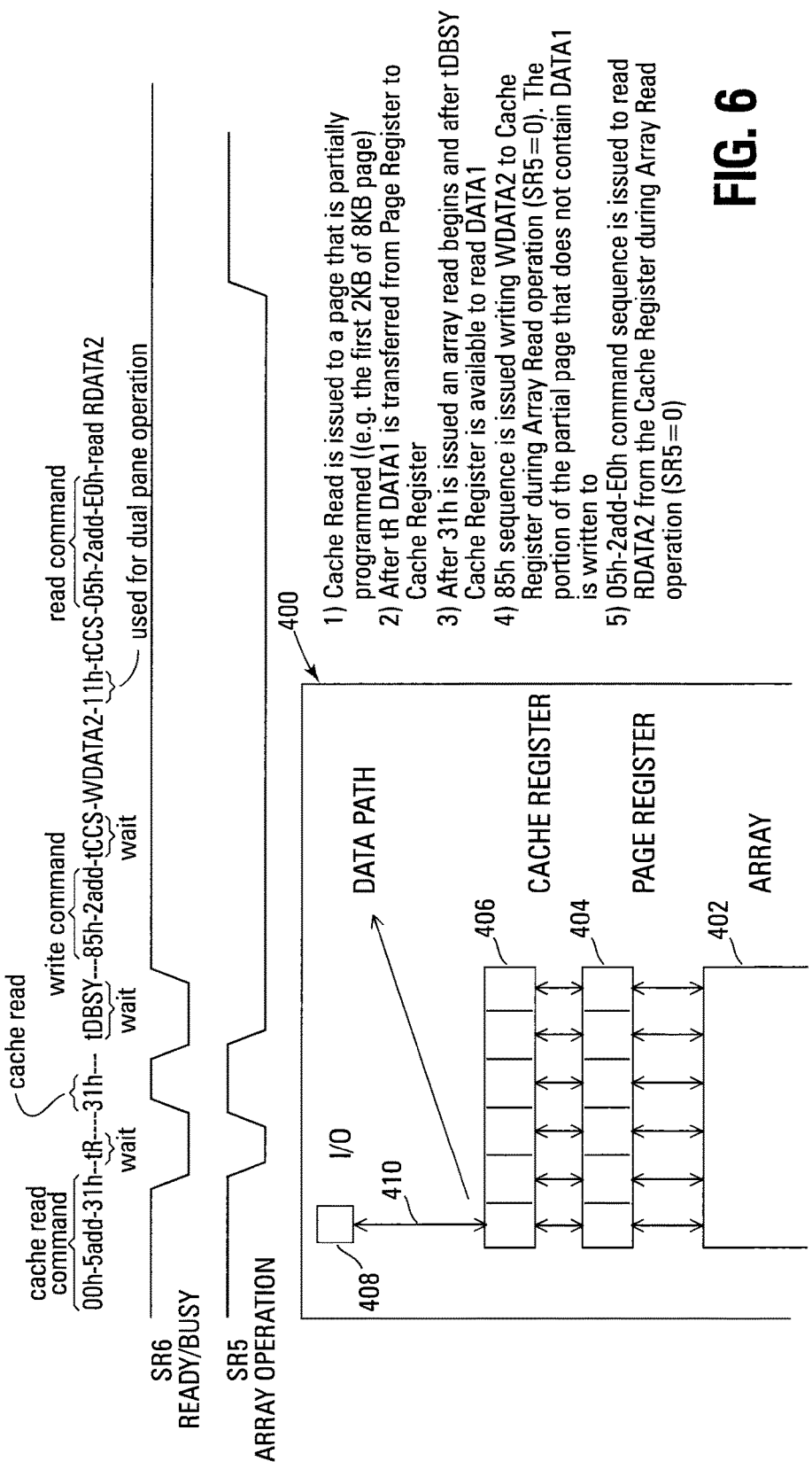
FIG. 6 is a block schematic of a portion of a memory and a timing diagram with operational codes according to a read sequence embodiment of the disclosure.

FIG. 6 shows an example of the operation and operational codes for the method of FIG. 5. The memory device 400 of FIG. 6 is the same as that shown in FIG. 4, and like numerals indicate like elements. For a read operation, a cache read command is issued to a page that is partially programmed, for example 2 KB of an 8 KB page. Partial page data is transferred from the array 402 to the page register 404. Then, another cache read command writes the data from the page register 404 to the cache register 406. At this point, the cache register 406 contains the partial page data from the array 402. The data comprises programmed data and blank (e.g., unprogrammed) data. Another read operation can then be started. As that second read operation is active, a second partial set of data is written to the blank section of the cache register 406, and that second partial set of data is read from the cache register 406 and compared to the original second partial set of data. If the two sets of data match, data path integrity is confirmed. This is accomplished during a read operation by allowing, through the debug mode, commands normally restricted during array operation. Only the test data written to the cache register is read from the cache register in one embodiment. Further, this method bypasses array bit errors by testing only the data path integrity, since no data are being read from the array 402.

In another embodiment, instead of keeping the cache register uncleared for the method of FIG. 5, the cache register is cleared while the second read operation is active. In this embodiment, the writing and reading of data may be to any part of the cache register.

Figure 7:
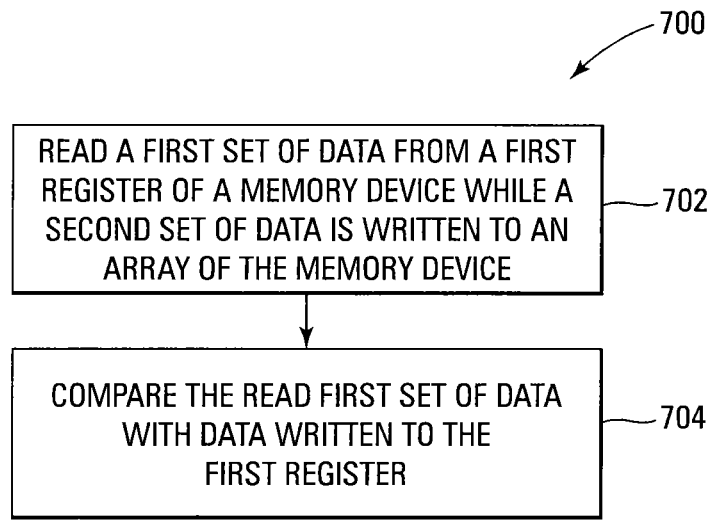
FIG. 7 is a flow chart diagram of a method according to another embodiment of the disclosure.

In another embodiment, a method 700 of verifying data path integrity in a memory device is shown in flow chart form in FIG. 7. Method 700 comprises reading a first set of data from a first register of the memory device while a second set of data is written to an array of the memory device in block 702, and comparing the read first set of data with data written to the first register in block 704.

Figure 8:
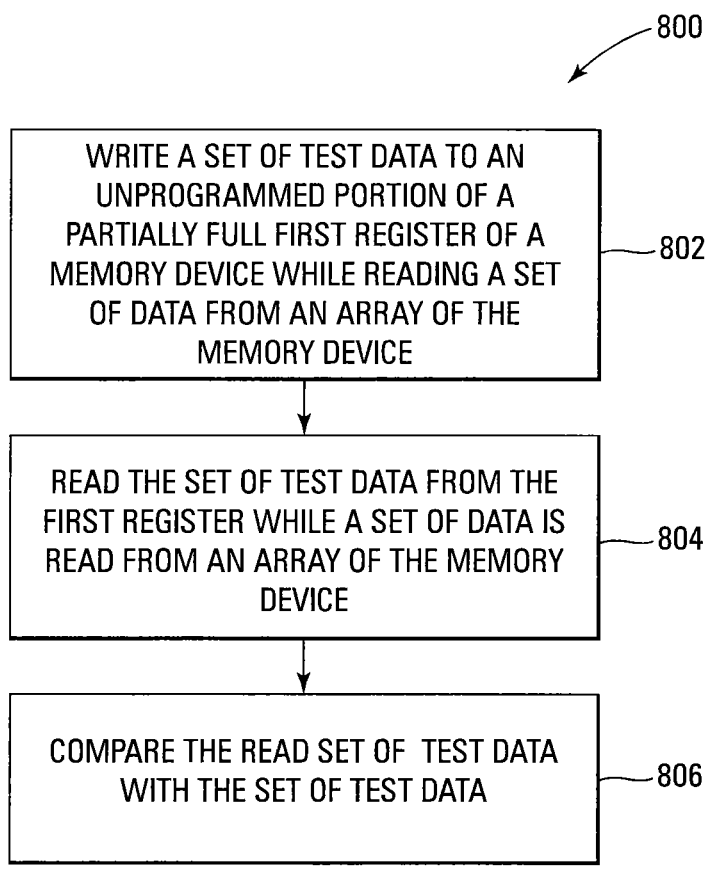
FIG. 8 is a flow chart diagram of a method according to yet another embodiment of the disclosure.

In still another embodiment, a method 800 of verifying data path integrity in a memory device is shown in flow chart form in FIG. 8. Method 800 comprises writing a set of test data to an unprogrammed portion of a partially full first register of the memory device while reading a set of data from an array of the memory device in block 802, reading the set of test data from the first register while a set of data is read from an array of the memory device in block 804, and comparing the read set of test data with the set of test data in block 806.

CONCLUSION

In summary, one or more embodiments of the disclosure show verification of data path integrity during array operations of a memory device. This is accomplished, for example, by comparing a set of test data with data written from the memory device or to the memory device in a debug mode of the memory device.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of verifying data path integrity in a memory device, comprising:
    loading a first set of data from a data source external to the memory device into a first register of the memory device;
    transferring the first set of data from the first register into a second register of the memory device;
    clearing the first register;
    loading a second set of data from the data source into the first register during programming of the first set of data from the second register to an array of memory cells of the memory device, the array of memory cells logically arranged in rows and columns;
    reading the second set of data from the first register during programming of the first set of data to the array of memory cells from the second register and without previously transferring the second set of data from the second register into the first register; and
    comparing the second set of data read from the first register to the second set of data from the data source;
    wherein the first register is located in a data path between the array of memory cells and the data source.

2. The method of claim 1, wherein verifying data path integrity is performed in a debug mode during an array operation of the memory device.

3. The method of claim 1, and further comprising:
    entering a debug mode prior to loading the first set of data.

4. The method of claim 3, wherein commands for verifying data path integrity are available only in the debug mode.

5. The method of claim 3, and further comprising exiting the debug mode after comparing the second set of data read from the first register to the second set of data from the data source.

6. The method of claim 1, wherein verifying data path integrity is performed during a program operation.

7. The method of claim 1, wherein the first register is a cache register and the second register is a page register.

8. A method of verifying data path integrity in a memory device, comprising:
    reading a first set of data from a first register of the memory device while a second set of data is being written to an array of memory cells of the memory device from a second register of the memory device and without previously loading the first set of data into the first register from the second register, the array of memory cells logically arranged in rows and columns; and
    comparing the read first set of data with data used in loading the first set of data to the first register and obtained from a source external to the memory device;
    wherein the first register is located in a data path between the array of memory cells and the source of the data used in loading the first set of data to the first register.

9. The method of claim 8, wherein writing the second set of data to the array of memory cells comprises:
    loading the second set of data to the first register prior to loading the first set of data to the first register;
    transferring the second set of data from the first register to the second register;
    clearing the first register;
    writing the second set of data to the array of memory cells from the second register; and
    loading the first set of data to the first register while the second set of data is being written to the array of memory cells.

10. The method of claim 8, wherein verifying data path integrity is performed in a debug mode during an array operation of the memory device.

11. The method of claim 8, and further comprising:
    entering a debug mode prior to loading the first set of data.

12. The method of claim 11, wherein commands for verifying data path integrity are available only in the debug mode.

13. The method of claim 11, and further comprising exiting the debug mode after comparing the read first set of data with the data used in loading the first set of data to the first register.

14. A memory device comprising:
    an array of memory cells logically arranged in rows and columns; and
    memory control circuitry configured to verify data path integrity in the memory device, the memory control circuitry configured to read a first set of data from a first register of the memory device while a second set of data is being written to the array of memory cells of the memory device from a second register of the memory device and without previously loading the first set of data into the first register from the second register, and to compare the read first set of data with data used in loading the first set of data to the first register and obtained from a source external to the memory device, wherein the first register is located in a data path between the array of memory cells and the source of the data used in loading the first set of data to the first register.

15. The memory device of claim 14, wherein the memory control circuitry is further configured to write the second set of data to the array of memory cells by loading the second set of data to the first register prior to loading the first set of data to the first register, transferring the second set of data from the first register to the second register, clearing the first register, writing the second set of data to the array of memory cells from the second register, and loading the first set of data to the first register while writing the second set of data to the array of memory cells.

16. The memory device of claim 14, wherein the memory control circuitry is further configured to verify data path integrity in a debug mode during an array operation of the memory device.

17. The memory device of claim 15, wherein the data path comprises a physical connection between the second register and a plurality of input/output connections of the memory device.

18. The memory device of claim 15, wherein the first register is operably connected to the array of memory cells, the second register is operably connected to the first register, and wherein the memory device further comprises:
    a plurality of input/output connections; and
    wherein the data path is connected between the second register and the plurality of input/output connection.

19. The memory device of claim 18, wherein the memory control circuitry is further configured to write a set of test data to an unprogrammed portion of a partially full first register of the memory device while reading a third set of data from the array of memory cells of the memory device, to read the set of test data from the first register while reading the third set of data from the array of memory cells of the memory device, and to compare the read set of test data with the set of test data.

* * * * *